(12) United States Patent
Spence

(10) Patent No.: US 6,437,348 B1
(45) Date of Patent: Aug. 20, 2002

(54) SIMULTANEOUS HEATING AND EXPOSURE OF RETICLE WITH PATTERN PLACEMENT CORRECTION

(75) Inventor: Christopher F. Spence, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/422,310

(22) Filed: Oct. 21, 1999

(51) Int. Cl.[7] .............................. A61N 5/00; G21G 5/00
(52) U.S. Cl. .................. 250/491.2; 250/492.1
(58) Field of Search .............. 250/492.2, 491.1; 378/34

(56) References Cited

U.S. PATENT DOCUMENTS

| | | | | |
|---|---|---|---|---|
| 4,229,232 A | * | 10/1980 | Kirkpatrick | 148/1.5 |
| 4,665,541 A | * | 5/1987 | Yaakobi et al. | 378/34 |
| 4,788,124 A | * | 11/1988 | Wright | 430/138 |
| 5,136,169 A | | 8/1992 | Smith et al. | 250/491.1 |
| 5,364,740 A | * | 11/1994 | Fohrenkamm et al. | 430/294 |
| 5,892,230 A | | 4/1999 | Goodberlet et al. | 250/491.1 |

\* cited by examiner

*Primary Examiner*—Bruce Anderson
(74) *Attorney, Agent, or Firm*—Renner, Otto, Boisselle & Sklar, LLP

(57) ABSTRACT

A device for exposing and heating a substrate coated with resist includes an exposure tool for selectively exposing the resist, and a heater for heating the exposed resist, the exposure tool and the heater able to simultaneously act on different portions of the resist. A method of patterning resist on a substrate includes the steps of selectively exposing the resist on the first portion of the substrate, heating the resist on the first portion, and simultaneously or thereafter selectively exposing the resist on a second portion of the substrate. In an exemplary embodiment the exposure tool is an electron beam generator for exposing a chemically-amplified resist, and the heater is a light source such as a laser light source which does not appreciably expose the resist. The device and method allow a post-exposure heating with a smaller delay between the exposure and the heating than with conventional methods, which involve exposing a reticle and mask completely before heating by baking.

20 Claims, 3 Drawing Sheets

SIMULTANEOUS HEATING AND EXPOSURE OF RETICLE WITH PATTERN PLACEMENT CORRECTION

BACKGROUND OF THE INVENTION

1. Technical Field of the Invention

The present invention involves a device and a method used in the field of manufacturing reticles and masks which are manufactured using resist-coated substrates.

2. Background of The Prior Art

Electron beam lithography involves use of focused electron beams to expose radiation-sensitive resist materials. Such lithography is advantageous because electron beams can be readily scanned and accurately positioned on substrates.

Electron beam lithography can involve long exposure times (writing times) for producing reticles, the exposure times often being on the order of hours. The problem of long exposure times has become worse with the increasingly large size of reticles to be written, and with the increased desirability of small feature sizes, because smaller feature sizes require smaller electron beams.

One possible solution to the long writing times is to employ chemically amplified electron-sensitive resists. Such chemically amplified resists require less energy for exposure, thus reducing writing times. However, chemically amplified resists are prone to chemical instability after exposure. This chemical instability can be overcome by baking the resist after exposure. Presently, such baking is performed after all of the exposure of the resist has been accomplished. This may result in unacceptable delays between the writing and baking processes, especially in view of the trends noted above toward larger reticles and smaller feature sizes.

From the foregoing, it is seen that it would be advantageous to have improved methods for using electron beams to expose chemically amplified resists.

SUMMARY OF THE INVENTION

A device for exposing and heating a substrate coated with resist includes an exposure tool for selectively exposing the resist and a heater for heating the exposed resist. A method of patterning resist on the substrate includes selectively exposing resist on a first portion of a substrate, heating the exposed resist on the first portion of the substrate, and selectively exposing resist on a second portion of the substrate. According to a particular embodiment of the invention, the heating of the first portion and the exposing of the second portion may be performed simultaneously.

According to an aspect of the invention, a device for exposing and heating resist includes a sensor for detecting position of a grid which is on the resist or reticle. This allows correction of the selective exposure of the reticle to account for changes in the alignment between the reticle and an exposure tool. Such changes in alignment may be due, for example, to heating of portions of the resist.

According to another aspect of the invention a method of exposing and heating resist on a substrate includes compensating for changes in the position of the resist due to expansion of the substrate and/or the resist layer atop the substrate due to heating of the resist and/or the substrate.

According to yet another aspect of the invention, a device for exposing and heating a substrate coated with resist includes an electron beam generator and a laser light source operatively coupled to the electron beam generator.

According to a further aspect of the invention, a device for exposing and heating a substrate coated with resist includes an exposure tool for selectively exposing the resist and a heater for heating exposed resist, the heater operatively coupled to the exposure tool. The exposure tool simultaneously act on different portions of the resist.

According to a still further aspect of the invention, a method of patterning resist on a substrate includes the steps of 1) selectively exposing the resist on a first portion of the substrate; 2) heating the resist on the first portion; and 3) selectively exposing the resist on a second portion of the substrate.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
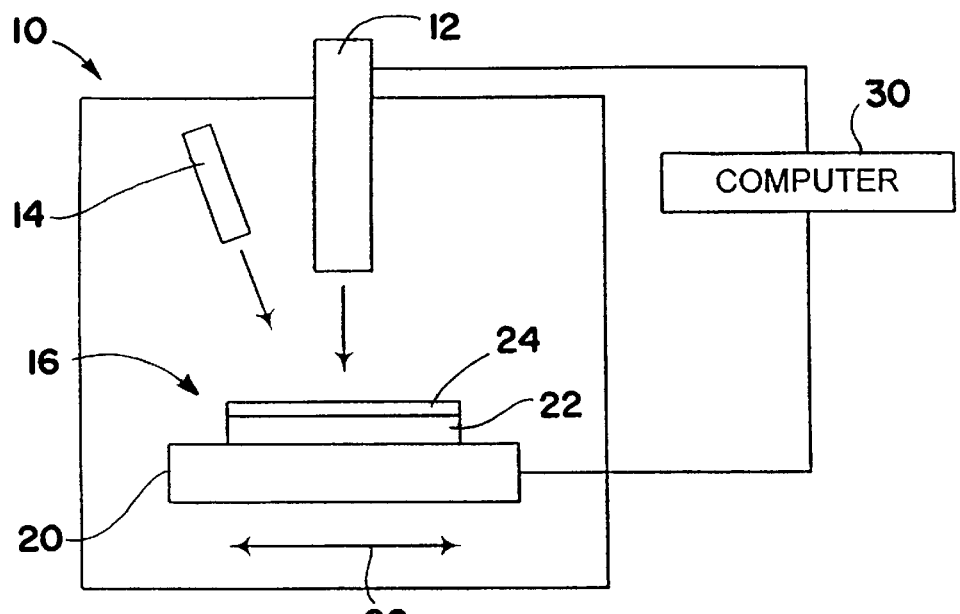
FIG. 1 is a schematic side view of a device in accordance with the present invention for exposing and heating a substrate coated with resist.

Referring initially to FIG. 1 a device or system 10 for exposing and heating a substrate coated with resist is shown. The device 10 includes an exposure tool 12 and a heater 14 which is operatively coupled to the exposure tool 12. The device 10 is used in the manufacture of a reticle or mask 16 which is mounted on a stage 20 which may be part of the device 10. The reticle or mask 16 includes a substrate 22 with a layer of resist 24 atop the substrate. The exposure tool 12 is used to selectively expose portions of the resist layer 24.

The exposure tool 12 and the resist used for the layer of resist 24 are selected to be compatible. That is, the exposure tool 12 emits energy of a type that will cause exposure of the resist. For example, the resist may be a photoresist (a resist exposed by irradiation with light of an appropriate wavelength) with the exposure tool being a light source which produces light for exposing the photoresist. A large variety of light sources and compatible photoresists are well known. Further information regarding optical lithography may be found in Chapters 12 and 13 of Silicon Processing For the VLSI Era, Volume 1, by Stanley Wolf, which are incorporated herein by reference.

Alternatively, the exposure tool may be an electron beam generator which outputs a focused beam of electrons. Electron beam lithography is described in detail in Chapter 14 of Silicon Processing For the VLSI Era, Volume 1, by Stanley Wolf, which is incorporated herein by reference. The electron beam is used to define a pattern in an electron-sensitive resist. Many types of electron beam generators and electron-sensitive resists are known in the art. An exemplary electron beam generator is one available from Etec Systems, Inc. of Hayward, Calif. Many types of electron-sensitive resists may be employed for use with an electron beam generator. Included among these are chemically amplified electron-sensitive resists, which require less energy to expose when compared with conventional electron-sensitive resists.

It is desirable for the electron-sensitive resist employed to be a chemically-amplified resist which requires less energy for exposure than conventional electron-sensitive resists in order to reduce writing (exposure) time. An example of a positive chemically-amplified electron-sensitive resist is Shipley UV5; an example of a negative chemically-amplified electron-sensitive resist is Sumitomo NEB-22.

In patterning the layer of resist 24, the stage 20 upon which the reticle 16 is placed may move in one or more directions, as indicated by arrow 26 in FIG. 1. Alternatively or in addition, the exposure tool 12 may move in one or more directions relative to the stage 20. The exposure tool 12 is operatively coupled to a controller such as a computer 30 which controls the output of energy from the exposure tool 12 which is incident on the layer of resist 24.

It will be appreciated that the foregoing merely describes one example of how the exposure tool may be moved relative to the resist layer and controlled to selectively expose the resist. Other means may be employed to control which part of the resist layer is being written at any given time, and the exposure within the area being written. For example optics or other mechanisms in the exposure tool may be employed to redirect the energy beam emerging from the exposure tool to different parts of the resist layer. Alternatively or in addition, a mask may be interposed between the exposure tool and the resist layer to partially or totally block energy emerging from the exposure tool from exposing portions of the resist layer.

The device 10 includes a controlled environment chamber 34 for providing a controlled environment in which the exposure and heating of the resist takes place. For example, the controlled environment chamber may be a vacuum chamber which allows unhindered passage of electrons from an electron beam generator to the resist layer. It will be appreciated that a controlled environment chamber may be omitted where a controlled environment is not required for the operation of the exposure tool.

Following exposure of the resist it is desirable to heat or bake the resist in order to make the exposed resist soluble or insoluble in the developer, depending on the type of resist (positive or negative) used. From the point of view of maintaining the chemical stability of the exposed resist it is desirable that the time between exposure and post-exposure heating or baking be small. Therefore the device 10 has a heater 14 such that heating of exposed portions of the resist layer 24 may be accomplished while other parts of the resist layer are still being written or are awaiting writing by the exposure tool 12.

Figure 2:
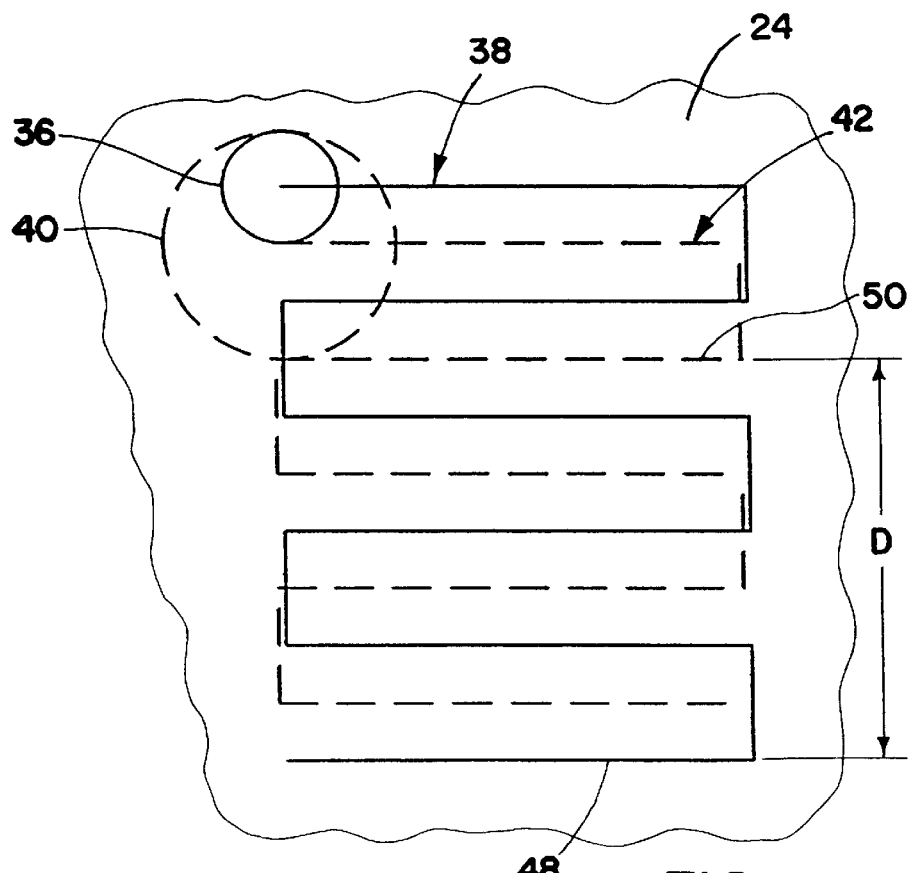
FIG. 2 is a plan view of a portion of the resist layer showing an exposure path and a heating path from use of the device of FIG. 1.

Exemplary paths for exposing and heating the resist are illustrated in FIG. 2. The exposure tool 12 creates an exposure spot 36 on a portion of the resist layer 24. The exposure spot is depicted in FIG. 2 as circular, but it will be appreciated that it may have other shapes. The exposure spot 36 moves along the resist layer 24 along an exposure path 38, following a raster scan pattern. Although the term "raster scan" is used herein, this invention is also applicable to vector scan where subfields are scanned, with a raster method used when moving from one subfield to another. The term "raster scan" as used herein should be considered as including use of such a raster method when moving from one subfield to another. As described above, this motion along the resist layer may be due to movement of the stage, movement of the exposure tool, or redirecting of the energy beam from the exposure tool. The energy beam may be selectively turned on and off to selectively expose portions of the resist layer 24.

The heater causes a portion of the resist layer to be heated as shown by heating spot 40 in FIG. 2. The heating spot is depicted as circular but may have other shapes. The heating spot 40 follows along a heating path 42 on the resist layer 24. As shown, the heating path 42 is similar to the exposure path 38. However, for the reasons given below the heating is limited to portions of the resist layer that have already been exposed. Thus there may be an offset distance D between the location of the heating spot 40 and the exposure spot 36 at any given time. For example, while the portion of the resist layer 24 along exposure path portion 48 is being selectively exposed, a different portion of the resist layer 24 along heater path portion 50 is being heated.

The exposure tool 12 and the heater 14 may be combined in a single unit. They may have a set offset distance between them, or alternatively may have an offset distance that is adjustable. The exposure tool 12 and the heater 14 may move together as a unit, or may alternatively move separately.

It will be appreciated that heater 14 may have a differently-shaped path of travel than the exposure tool 12. There may be a prescribed delay between exposure by the exposure tool and heating by the heater instead of a prescribed offset distance.

Figure 3:
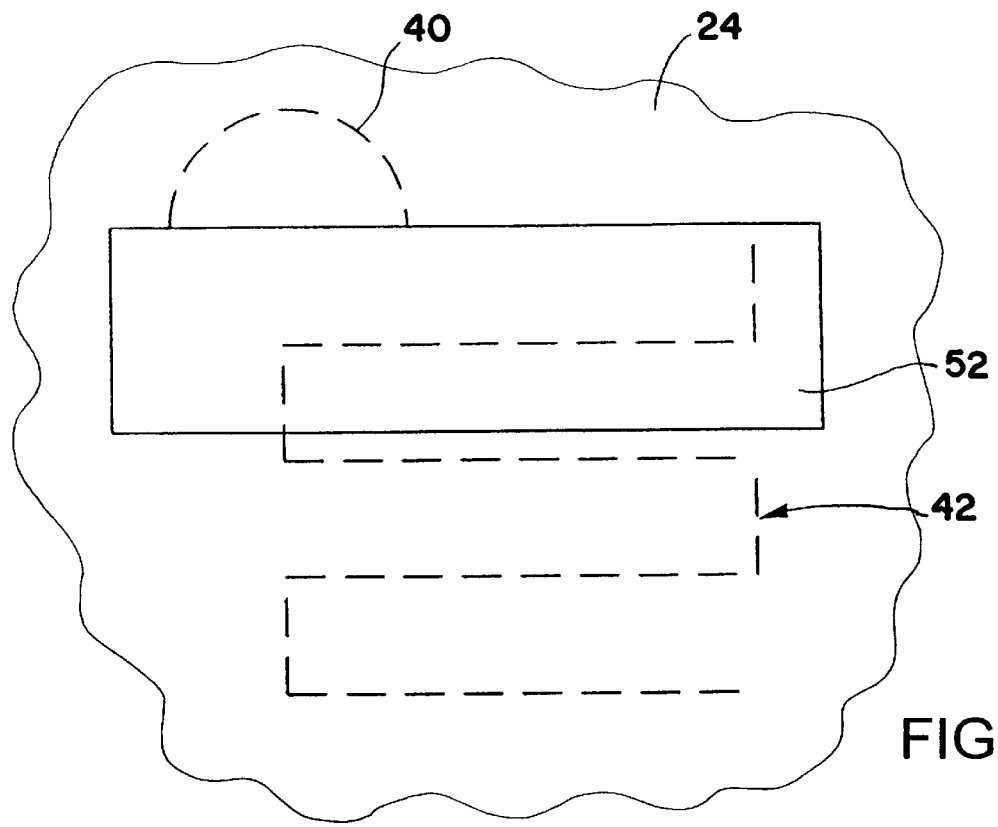
FIG. 3 is a plan view of the resist layer showing the position of a barrier which is part of the device of FIG. 1.

As shown in FIG. 3 the device 10 may include a barrier 52 which blocks a portion of the heat in the heating spot 40 from reaching the resist layer 24. The barrier may move along with movement of the heating spot 40 or may alternatively be separately movable. It will be appreciated that the barrier 52 may be integrated with the rest of the device 10 in a variety of ways. In particular, the barrier 52 may be integrated to move along with the exposure tool 12 and/or the heater 14. The barrier may be used to provide additional control of the heating in order to reduce the time between exposure and heating, while preventing heating of unexposed resist and while preventing other interference with the exposure process due to the heating.

Figure 4:
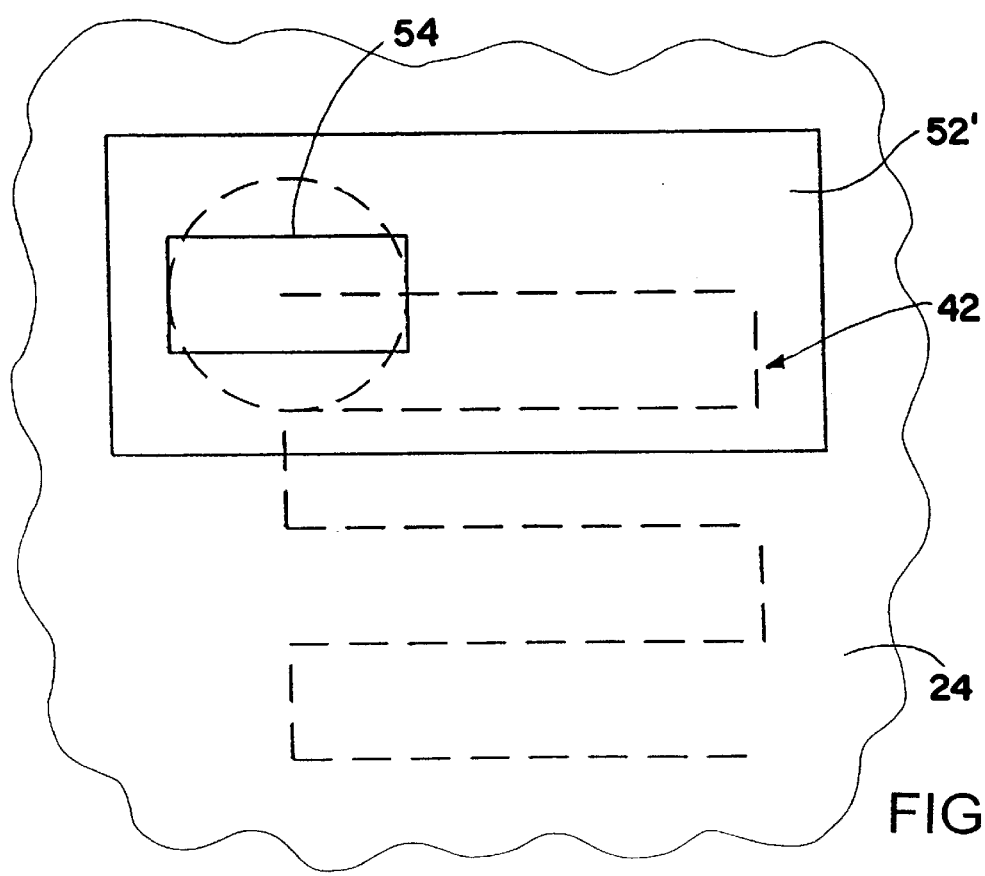
FIG. 4 shows an alternate embodiment barrier of the present invention.

Referring to FIG. 4 an alternate embodiment barrier 52' is shown. The barrier 52' has a slot 54 through which energy from the heater may pass to heat a desired portion of the resist layer 24. It will be appreciated that such barriers may have multiple slots if desired, and that the slot or slots in a such barrier may be of various shapes.

It is desirable that the heating from the heater 14 be controlled so as to not appreciably heat unexposed portions of the resist layer 24 or the corresponding underlying portions of the substrate 22. There are at least two reasons for this. First, heating the substrate 22 and/or the resist layer 24 causes thermal expansion. Such thermal expansion may cause positioning errors when writing portions of the resist layer 24. Although, as described in greater detail below, it may be possible to compensate to some extent for positioning errors due to thermal expansion, it is desirable to minimize such positioning errors.

Second, heating of the resist layer prior to exposure may change the chemical kinetics of the exposure of the resist layer. It is well known that the rate of many if not most chemical reactions are altered by changes in temperature. Therefore heating of the resist layer 24 prior to or simultaneously along with exposure of the resist may cause unpredictable and unintended changes in exposure rates. Such changes may introduce errors in what portions of the resist layer are exposed.

Therefore it will be appreciated that the amount of delay between exposure and post-exposure heating will involve a compromise between the goal of achieving a small delay in order to minimize post-exposure, pre-heating chemical changes and the goal of avoiding heating of the resist prior to or during the exposure.

The heater 14 may employ any of various types of heating mechanisms.

For example, the heater may project energy such as microwave radiation or other visible or non-visible light energy upon the portion of the resist to be heated. An exemplary type of heater is an infrared laser, which has the useful property of being able to provide a high amount of energy in a focused beam. Preferably the heater employs a heating mechanism that at most minimally affects the amount of photoacid in the resist. The amount of energy output by the heater and the heating time (related to the speed of movement of the heater) are selected in order to provide the desired heating to chemically stabilize the exposed resist.

The device 10 therefore may be used to simultaneously selectively expose a portion of the resist layer 24 while heating an already exposed other portion of the resist layer. Alternatively, it will be appreciated that the device may be used to sequentially expose and heat successive discrete portions of the resist layer 24.

What follows are alternate embodiments of the invention. In the interest of brevity, some features of the alternate embodiments that are shared by the embodiment described heretofore are omitted. It will be appreciated that features of the various embodiments may be combined.

Figure 5:
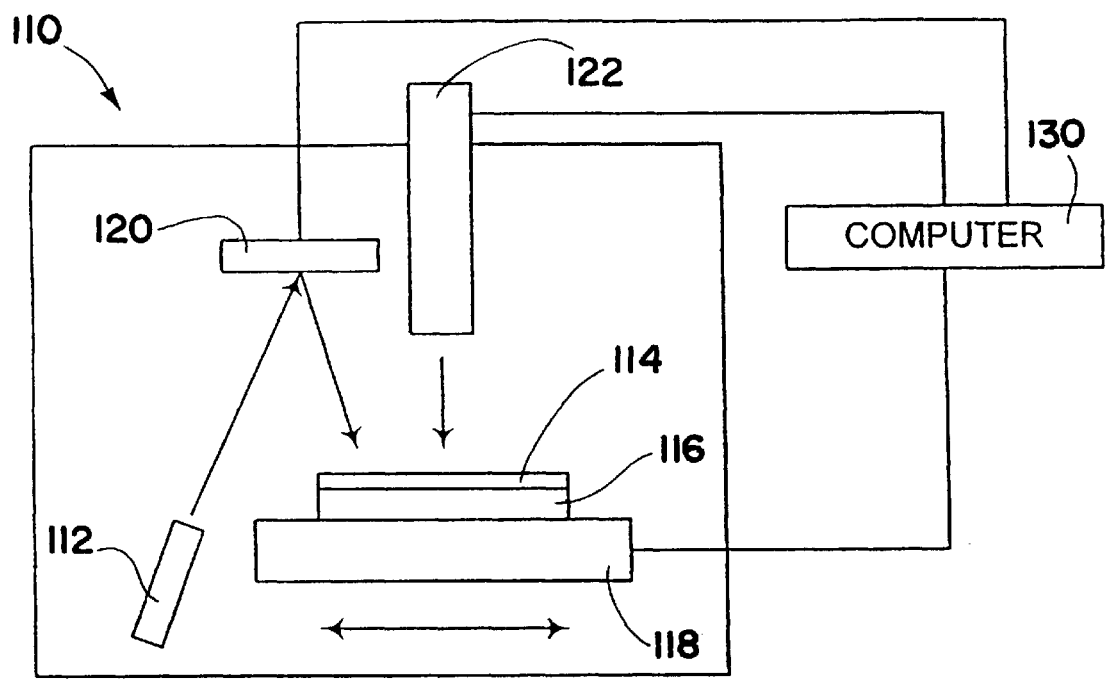
FIG. 5 is a side schematic view of an alternate embodiment device of the present invention for exposing and heating a substrate coated with resist.

Referring to FIG. 5, an alternate embodiment device 110 for exposing and heating a resist-coated substrate is shown. The device 110 includes a heating light source 112 for heating a resist layer 114 on a substrate 116 which is mounted on a stage 118. Light from the heating light source 112 is directed to the resist layer 114 through optics 120. Similar to the operation of the device 10 explained above, the light from the heating light source 112 is used to heat appropriate portions of the resist layer 114 after they have been selectively exposed by energy from an exposure tool 122. The optics 120 may be coupled to a controller such as a computer 130 to direct and/or otherwise control the heating of the resist layer 114.

An exemplary heating light source 112 is a laser, although it will be appreciated that other heating light sources may be involved. It will further be appreciated that a large variety of configurations of optics, involving optical elements such as mirrors and lenses, may be employed to redirect and position light from the heating light source 112.

Figure 6:
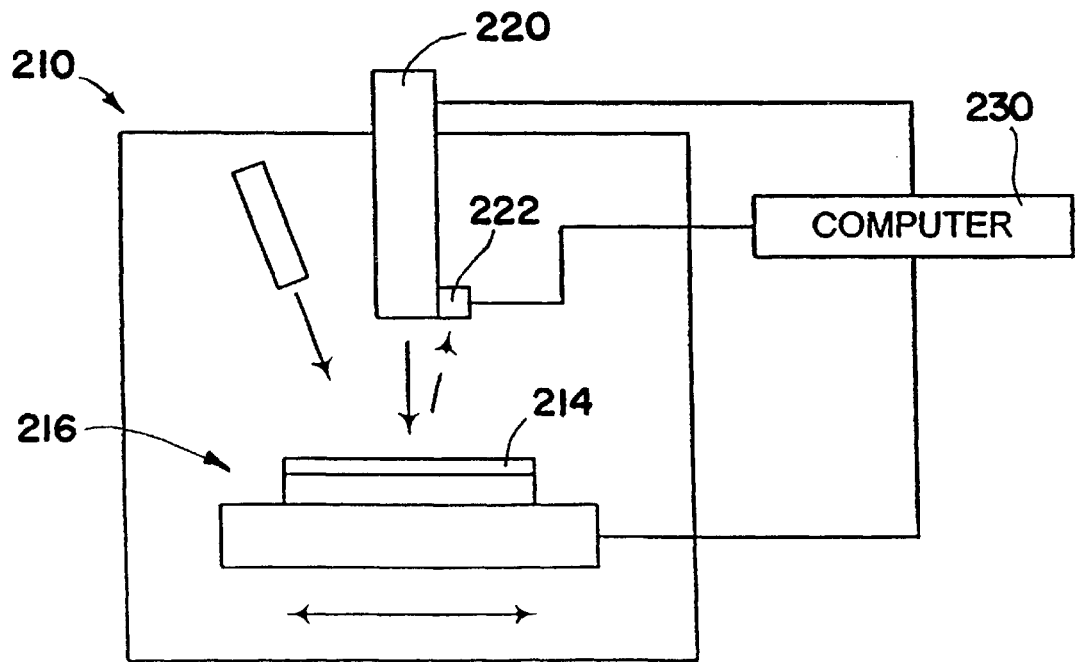
FIG. 6 is a side schematic view of another alternate embodiment device of the present invention for exposing and heating a substrate coated with resist.

Referring to FIG. 6, an alternate embodiment device 210 for exposing and heating is shown which employs feedback for positioning a resist layer 214 of a reticle or mask 216 relative to an exposure tool 220. The resist layer 214 has incorporated thereupon a holographic reference grid. Such grids are discussed in U.S. Pat. No. 5,892,230 issued to Goodberlet et al., entitled "Scintillating Fiducial Patterns", the background section of which is herein incorporated by reference. Such superimposed grids allow the relative positions of the exposure tool 220 and the resist layer 214 to be monitored, with suitable alterations in the patterning of the resist layer to be made as necessary.

The device 210 includes a sensor 222 as well as a controller such as a computer 230 which is operatively coupled to the sensor 222 and the exposure tool 220. The sensor 222 detects the position of the grid on the resist layer 214 and relays this information to the computer 230 for use in controlling the timing of energy releases from the exposure tool 220 and/or the relative position of the exposure tool 220 and the resist layer 214. The sensor may detect the position of the grid layer by for example detecting the emission of secondary electrons from the resist layer 214, the emission of secondary electrons being caused by incidence of an electron beam from the exposure tool on the resist layer. By using positional information from the grid, correction can be made for misalignment of the reticle and exposure tool due to expansion of the reticle from the post-exposure heating, or due to other reasons.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A device for exposing and heating a substrate coated with resist, comprising:
    an exposure tool for selectively exposing the resist; and
    a heater for heating exposed resist, the heater operatively coupled to the exposure tool;
    wherein the heater and the exposure tool substantially simultaneously independently act on different portions of the resist.

2. The device of claim 1, wherein the exposure tool is an electron beam generator.

3. The device of claim 1, wherein the exposure tool is a light source which emits light to which the resist is sensitive.

4. The device of claim 1, wherein the heater is a light source which emits light to which the resist is substantially insensitive.

5. The device of claim 1, further comprising a controller which operatively couples the heater to the exposure tool.

6. The device of claim 1, wherein the heater is in a fixed position relative to the exposure tool.

7. The device of claim 1, wherein the exposure tool and the heater include respective separate, independently-actuatable radiation sources.

8. A device for exposing and heating a substrate coated with resist, comprising:
   an exposure tool for selectively exposing the resist; and
   a heater for heating exposed resist, the heater operatively coupled to the exposure tool;
   wherein the heater and the exposure tool substantially simultaneously act on different portions of the resist;
   wherein the heater is a light source which emits light to which the resist is substantially insensitive; and
   wherein the light source is a laser light source.

9. A device for exposing and heating a substrate coated with resist, comprising:
   an exposure tool for selectively exposing the resist;
   a heater for heating exposed resist, the heater operatively coupled to the exposure tool; and
   a substrate alignment monitor operatively coupled to the exposure tool;
   wherein the heater and the exposure tool substantially simultaneously act on different portions of the resist.

10. The device of claim 9, wherein the substrate alignment monitor detects the position of an alignment pattern on the substrate.

11. A device for exposing and heating a substrate coated with resist, comprising:
   an exposure tool for selectively exposing the resist; and
   a heater for heating exposed resist, the heater operatively coupled to the exposure tool;
   wherein the heater and the exposure tool substantially simultaneously act on different portions of the resist; and
   wherein the heater and the exposure tool are coupled so as to provide an offset distance between the different portions of the resist.

12. A device for exposing and heating a substrate coated with resist, comprising:
   an exposure tool for selectively exposing the resist;
   a heater for heating exposed resist, the heater operatively coupled to the exposure tool; and
   a barrier between the heater and the resist for inhibiting heating of at least some of the resist;
   wherein the heater and the exposure tool substantially simultaneously act on different portions of the resist.

13. The device of claim 12, wherein the barrier has an opening therein to allow heating of a part of the resist.

14. A method of patterning resist on a substrate comprising:
   selectively exposing the resist on a first portion of the substrate;
   heating the resist on the first portion; and
   selectively exposing the resist on a second portion of the substrate;
   wherein the heating the resist on the first portion and the selectively exposing the resist on the second portion are performed substantially simultaneously.

15. The method of claim 14, wherein the first portion and the second portion are offset by an offset distance and further comprising, prior to the heating, selecting the offset distance.

16. The method of claim 14, wherein the resist is a photoresist, and the selectively exposing resist on the portions of the substrate includes selectively exposing the photoresist by irradiating selective regions.

17. The method of claim 14, wherein the resist is sensitive to electron exposure, and the selectively exposing resist on the portions of the substrate includes using an electron beam to expose the resist.

18. The method of claim 14, further comprising monitoring position of the substrate during the exposing and the heating.

19. The method of claim 18, wherein the monitoring includes tracking the position of a grid on the substrate.

20. The method of claim 14, wherein the selectively exposing resist on the portions of the substrate includes raster scanning.

* * * * *